(12) United States Patent
Katsura et al.

(10) Patent No.: US 6,373,907 B1
(45) Date of Patent: Apr. 16, 2002

(54) WIRELESS TERMINAL DEVICE

(75) Inventors: Takatoshi Katsura; Kenji Itoh; Shinjirou Fukuyama; Mitsuru Mochizuki; Hiroaki Nagano; Yoshinori Matsunami; Fumio Ishizu; Ryoji Hayashi, all of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/695,405

(22) Filed: Oct. 25, 2000

Related U.S. Application Data

(63) Continuation of application No. PCT/JP99/00879, filed on Feb. 25, 1999.

(51) Int. Cl.[7] .............................. H04L 27/08; H04B 1/26
(52) U.S. Cl. ..................... 375/345; 455/324; 455/234.2; 455/245.2
(58) Field of Search ................................ 375/316, 317, 375/318, 319, 345; 455/323, 324, 232.1, 234.2, 241.1, 245.1, 245.2, 250, 251.1

(56) References Cited

U.S. PATENT DOCUMENTS

| | | | | |
|---|---|---|---|---|
| 5,095,536 A | * | 3/1992 | Loper | 455/324 |
| 5,166,634 A | * | 11/1992 | Narahashi et al. | 330/151 |
| 5,233,634 A | | 8/1993 | Väisänen | 455/234.1 |
| 5,852,772 A | * | 12/1998 | Lampe et al. | 455/226.2 |
| 6,006,079 A | * | 12/1999 | Jaffee et al. | 455/324 |
| 6,072,998 A | * | 6/2000 | Kaku | 455/234.2 |
| 6,175,728 B1 | * | 1/2001 | Mitama | 455/323 |

FOREIGN PATENT DOCUMENTS

| | | |
|---|---|---|
| JP | 1-101713 | 4/1989 |
| JP | 3-208433 | 9/1991 |
| JP | 6-244754 | 9/1994 |
| JP | 7-58561 | 3/1995 |
| JP | 10-22859 | 1/1998 |

* cited by examiner

*Primary Examiner*—Tesfaldet Bocure
(74) *Attorney, Agent, or Firm*—Rothwell, Figg, Ernst & Manbeck

(57) ABSTRACT

At the onset of an operation, a level of a base band signal at an input side of a variable gain amplifying circuit is detected by a logarithmic amplifier having a wide dynamic range, and, a control unit controls a gain of a low-noise amplifier in a previous step of a low-pass filter based on the detected level and also controls a gain of variable gain amplifier, whereby saturation at an analog base band portion is prevented even when the level of the input signal is high.

7 Claims, 7 Drawing Sheets

WIRELESS TERMINAL DEVICE

REFERENCE TO RELATED APPLICATION

This Application is a continuation of International Application No. PCT/JP99/00879, whose international filing date is Feb. 25, 1999, the disclosure of which is incorporated by reference herein.

BACKGROUND OF THE INVENTION

1. Field of the Invention

The present invention relates to wireless terminal devices and, more particularly to a wireless terminal device, such as a portable telephone, having a receiving unit with a direct conversion system in which a received signal is converted directly into a base band signal.

2. Description of the Background Art

In a heterodyne conversion system for receivers, which has been well known, a received signal is converted into an intermediate frequency (IF) signal by a mixer (MIX) and then an unwanted wave is removed by a band-pass filter (BPF) for the IF. After that, complex envelope detection is performed by a quadrature mixer (QMIX) to supply a base band signal. In the heterodyne conversion system, however, as the intermediate frequency exists an intermediate frequency circuit, such as a band-pass filter, must be provided, resulting in the increase in the number of components and space for mounting the components.

On the other hand, in a direct conversion system, a received signal is directly converted into a base band signal by a quadrature mixer. FIG. 1 is a block diagram referenced for describing the direct conversion system.

FIG. 1 shows an example in which the direct conversion system is employed for a portable telephone which operates according to a certain communication system, such as CDMA system, in which transmission and reception are performed simultaneously and, a transmission system connected to a duplexer (DUP) 2 is not shown.

In FIG. 1, a high-frequency signal received by an antenna 1 is supplied to a low-noise amplifier (AMP) 3 via duplexer 2, a received signal of a low level is amplified, an unwanted high-frequency band component such as an external interference wave is removed by a band-pass filter (BPF) 4 and the remaining component is converted into a base band signal by a quadrature mixer (QMIX) 5.

Here, the relation between a frequency $f_{rx}$ of the received signal, which is an output from band-pass filter 4 and a local oscillation frequency $f_{lo}$ of quadrature mixer 5 is represented by the following expression:

$$f_{bb} = f_{rx} - f_{lo},$$

where $f_{bb}$ is the base band signal. As the frequency of the base band signal is sufficiently lower than that of the received signal, $f_{rx} = f_{lo}$ holds.

The base band signal obtained through conversion is amplified by a low-noise amplifier (AMP) 6 and the resulting signal is supplied to a low-pass filter (LPF) 7 where an interference wave such as an adjacent channel component is removed from the base band signal. Further, the base band signal is supplied to a variable gain amplifier (VGA) 8 and amplified to maintain an input to an A/D converter 9 in the next stage at a constant level and, the resulting signal is converted into a digital signal by A/D converter 9 and, demodulated at a demodulation circuit (DEM) 10.

In the receiver of the direct conversion system shown in FIG. 1, the elimination of the mixer and the band-pass filter for the intermediate frequency required in the heterodyne conversion system is allowed to achieve a simple circuit structure. In addition, a spurious response of the receiver to a signal represented by an image signal can be mitigated whereby the high-frequency band-pass filter can be replaced with a smaller band-pass filter 4.

Further, a dynamic range of a receiver adapting the heterodyne system is controlled such that the gain of the variable gain amplifier becomes variable in an intermediate frequency portion and an input signal to a base band portion becomes fixed.

On the other hand, a receiver adapting the direct conversion system generally does not include an intermediate frequency portion having a variable gain amplifier, and hence, at the fluctuation of the input signal, if the gain is not changed accordingly at a high frequency portion, the level of an input signal to an analog base band portion including low-noise amplifier 6, low-pass filter 7 and variable gain amplifier 8 in FIG. 1 fluctuates.

Particularly, when a signal of a high range is to be input, an element with a wide dynamic range must be employed as the analog base band portion. In the direct conversion system, however, the use of the element with a wide dynamic range is more difficult than in the heterodyne system which has means for amplifying a gain at the intermediate frequency portion, because, in the direct conversion system, the intermediate frequency portion performing amplification with a very high gain is not provided and, very high gain, very low noise, and very good distortion characteristic are required in the analog base band portion. When these requirements are met and a wide dynamic range is achieved, if means for varying gain is provided in a path to the analog base band portion, saturation or distortion at the amplifier or the low-pass filter of the analog base band portion must be prevented at the input of a signal with a high level.

On the other hand, the above mentioned problems can be obviated by switching the gain at amplifier 3 in a high frequency stage. However, the accuracy of the gain control at amplifier 3 is hard to secure. Because a factor which is hard to be dealt with in the design consideration, such as parasitic capacitance by the high frequency, becomes noticeable and also because increase in the process variation makes it difficult to secure the accuracy of the gain. Further, because the amplifier employed in the high frequency portion often has unstable temperature characteristic. In addition, it is difficult to switch the gains of a plurality of stages at the high frequency stage with high accuracy.

Hence, a main object of the present invention is to provide a wireless terminal device wherein the accuracy of the gain control can be maintained and saturation at the base band portion can be prevented.

SUMMARY OF THE INVENTION

The present invention is a wireless terminal device directly converting a high frequency signal into a base band signal, wherein the base band signal generated by conversion is supplied to and amplified at an amplifying circuit 2, an interference wave signal component is removed from an output signal therefrom through a filter and the resulting signal is supplied to a variable gain circuit and, the level of the signal supplied to the variable gain circuit is detected, the gain of the amplifying circuit is switched based on a detection output and the gain of the variable gain circuit is controlled.

According to another aspect of the present invention, the amplification circuit has a variable gain and, the control circuit changes the gain of the amplification circuit based on the detection output of the level detection circuit.

According to still another aspect of the present invention, the amplification circuit includes a plurality of amplifiers with different gains, and a select circuit selecting one of the plurality of amplifiers based on a control signal.

According to still another aspect of the present invention, power supply to the amplifying circuit is cut off based on a control signal supplied from the control circuit to prevent the appearance of a signal of a high level on an output from the amplifying circuit.

According to still another aspect of the present invention, the amplification circuit, the filter, the variable gain circuit and the level detection circuit are arranged on the same integrated circuit and the integrated circuit is provided with a gain control circuit setting the gain of the amplification circuit based on a clock signal and data supplied from the control circuit.

According to still another aspect of the present invention, the control circuit supplies data on the gain to be set to the amplification circuit in synchronization with the clock signal in a time divisional manner.

According to still further aspect of the present invention, the gain control circuit switches each of the gain of the amplification circuit in a step-like manner.

The foregoing and other objects features, aspects and advantages of the present invention will become more apparent from the following detailed description of the present invention when taken in conjunction with the accompanying drawings.

DESCRIPTION OF THE PREFERRED EMBODIMENTS

Figure 1:
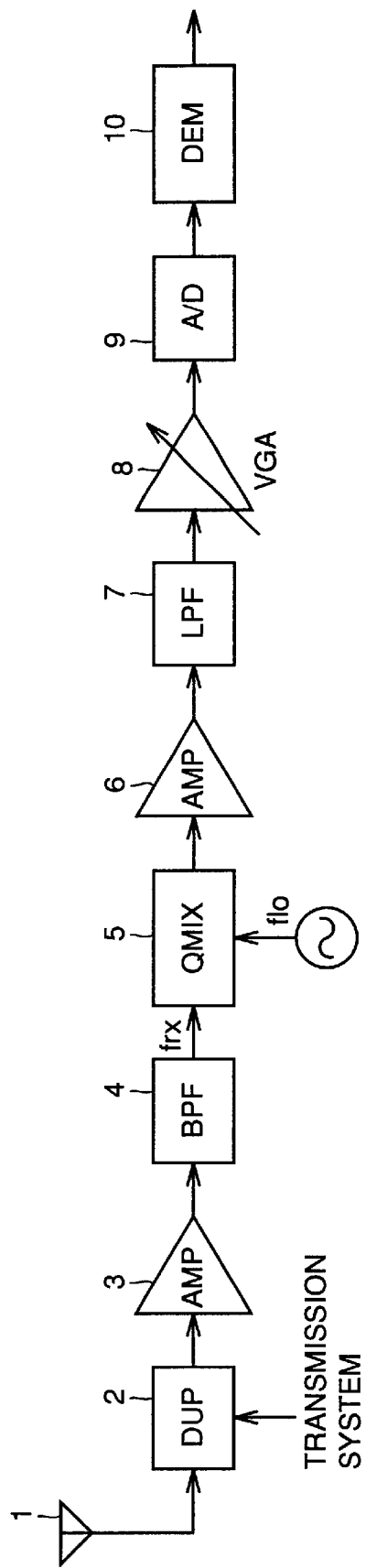
FIG. 1 is a block diagram of a receiving circuit adapting a direct conversion system, shown as a background art of the present invention.
Figure 2:
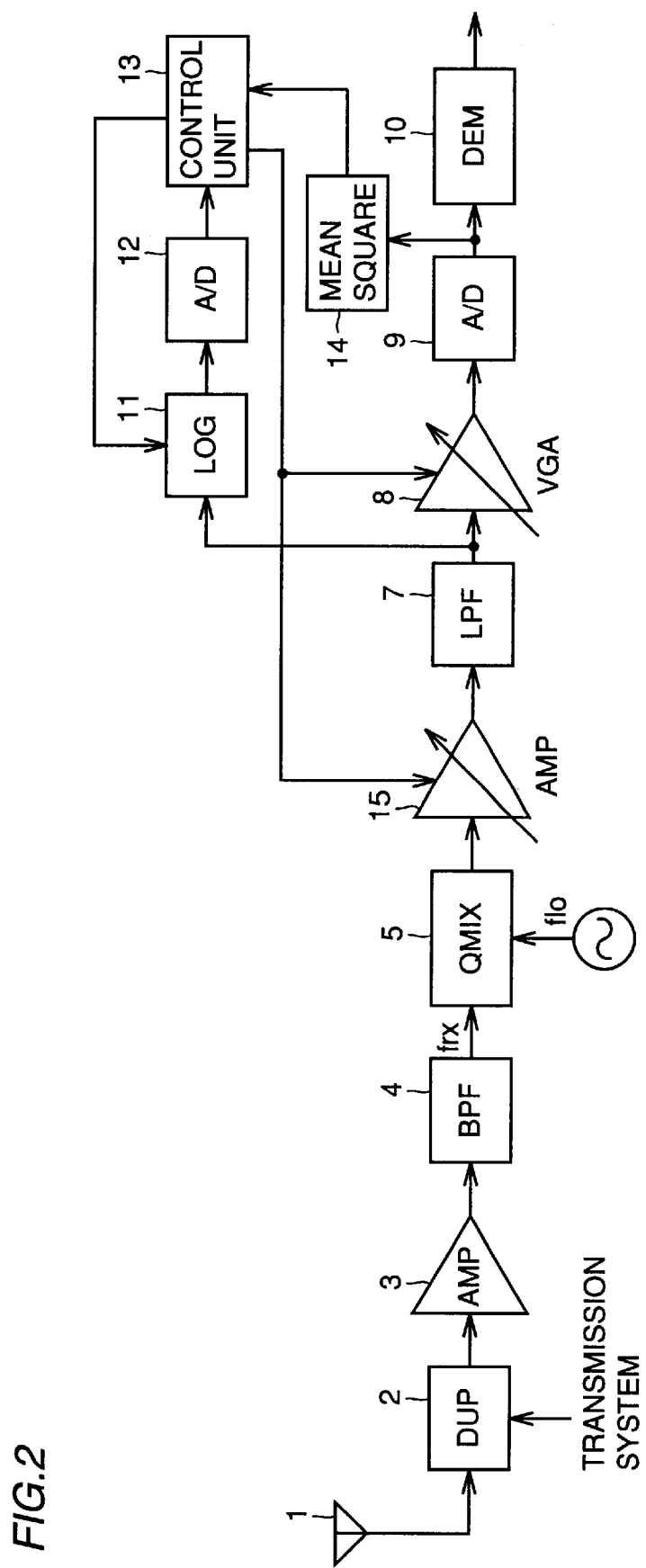
FIG. 2 is a block diagram showing the first embodiment of the present invention.

FIG. 2 is a block diagram of a receiver according to the first embodiment of the present invention. In FIG. 2, instead of amplifier 6 shown in FIG. 1, a gain-switchable low-noise amplifier 15 is provided and in addition, a logarithmic amplifier (LOG) 11, an A/D converter 12, a control unit 13 and a mean square deriving circuit 14 are provided as an example of level detection means.

Logarithmic amplifier 11 is for detecting a level of a base band signal, which is an input to variable gain amplifier 8, and has a wide input voltage range. Here, an A/D converter or the like can be used as level detection means instead of logarithmic amplifier 11. A detection output signal of logarithmic amplifier 11 is supplied to A/D converter 12 and converted into a digital signal and supplied to control unit 13. Mean square deriving circuit 14 is for detecting an output level of A/D converter 9 by deriving a mean square thereof and an output from mean square deriving circuit 14 is supplied to control unit 13. Based on the detection output in a digital format from logarithmic amplifier 11, control unit 13 coarsely controls gains of low-noise amplifier 15 and variable gain amplifier 8 such that saturation will not be caused at the base band portion when the level of input signal rises. Then, control unit 13 finely controls gains of low-noise amplifier 15 and variable gain amplifier 8 based on the output from mean square deriving circuit 14.

Hence, according to the embodiments, control unit 13 performs gain control such that when the level detected at logarithmic amplifier 11 is low, the gains of low-noise amplifier 15 and variable gain amplifier 8 are increased, whereas when the detected level is high the gains of low-noise amplifier 15 and variable gain amplifier 8 are decreased, therefore, the level of the analog base band signal can be set to an optimal value regardless of the level of the input signal, the increase in dynamic range is not necessary, size of the circuit can be made small and current consumption can be reduced.

Figure 3:
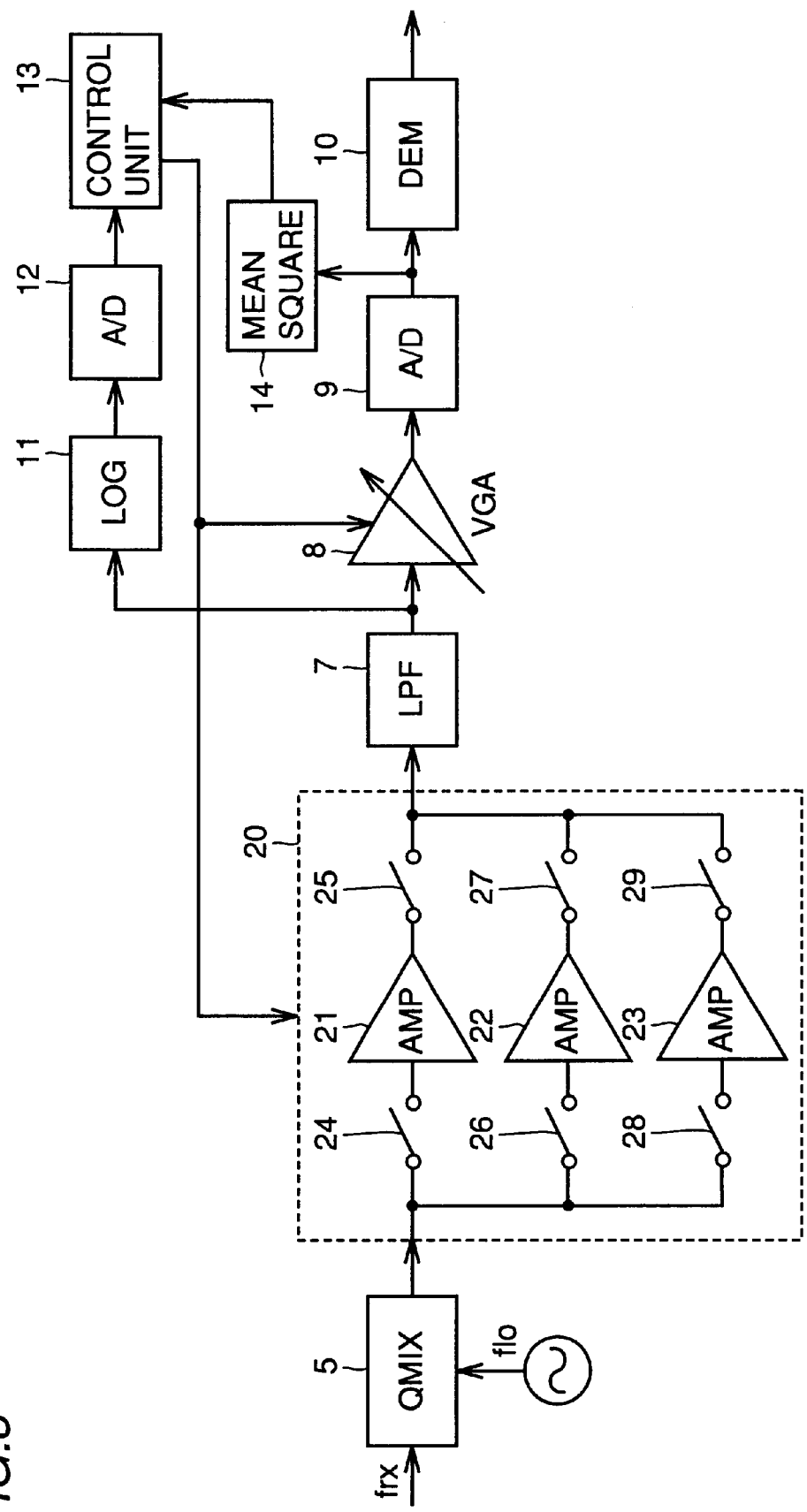
FIG. 3 is a block diagram showing the second embodiment of the present invention.

FIG. 3 is a block diagram of a receiver according to the second embodiment of the present invention. In this embodiment, amplifiers 21, 22 and 23 with different gains are provided in parallel as low-noise amplifying portion 20 of the base band portion and, switching circuits 24~29 are arranged at input sides and output sides thereof, respectively, and switching of switching circuits 24~29 are controlled by control unit 13 such that the saturation will not be caused at the analog base band portion when the level of the input signal becomes high, thus the gain control is performed.

For example, assume that the gain of amplifier 21 is set to 14 dB, the gain of amplifier 22 is set to 8 dB and the gain of amplifier 23 is set to 2 dB. If the level of the base band signal detected by logarithmic amplifier 11 is at a normal level, control unit 13 turns switching circuits 26 and 27 of amplifying portion 20 on and selects amplifier 22 whose gain is set to 8 dB. If the detection level of logarithmic amplifier 11 is low, switching circuits 24 and 25 are turned on to select amplifier 21 with a gain set to 14 dB and if the level detected by logarithmic amplifier 11 is high, switching circuits 28 and 29 are turned on to select amplifier 23 with a gain set to 2dB.

In FIG. 3, three amplifiers 21, 22 and 23 are provided in amplifying portion 20 for gain switching to keep the amount of gain variation small because if two amplifiers with different gains, for example, are provided to achieve simple two-stage switching, the amount of gain variation becomes large causing a problem of transient response at the gain switching. Therefore, preferably low-noise amplifying portion 20 is configured such that the gain is changed at least by three stages. Yet, if the effect of transient response on the system is insignificant, switching of the gain can be performed by two stages.

As described above, in the embodiment, the level of the analog base band signal can be suitably set even when the level of the signal input to antenna 1 is high or low through the selection of amplifiers 21, 22 and 23 with different gains in low-noise amplifying portion 20 according to respective gains, therefore, the signal level will not be saturated nor become insufficient and a wide dynamic range can be secured at the analog base band portion.

Here, in this embodiment, control unit 13 later finely controls gains of low-noise amplifier 20 and variable gain amplifier 8 based on the output of mean square deriving circuit 14.

At the base band frequency, an op-amp can be easily employed and the gain can be determined based on a simple ratio of resistance. In addition, as the accuracy of temperature characteristics of resistance is good, highly accurate control can be achieved at the base band frequency.

Figure 4:
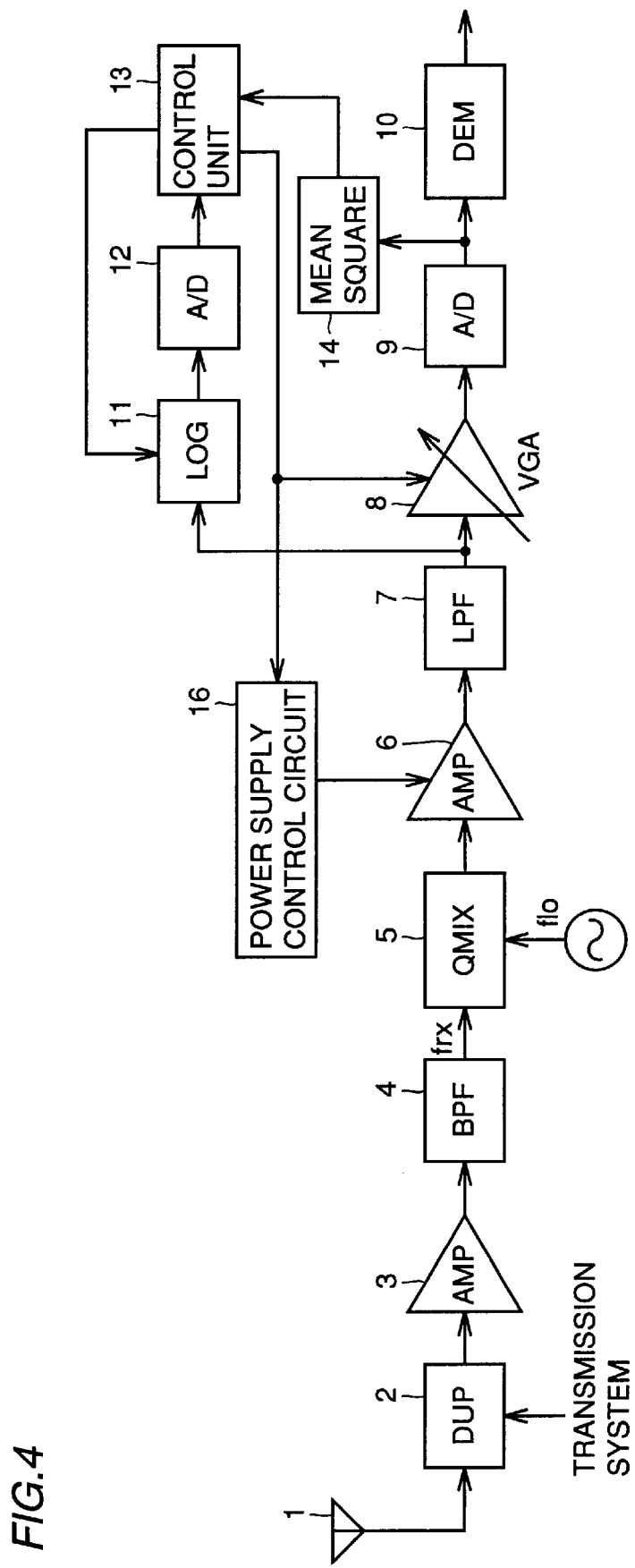
FIG. 4 is a block diagram showing the third embodiment of the present invention.

FIG. 4 is a block diagram of a receiver of the third embodiment of the present invention. In this embodiment, a power supply control circuit 16 is provided for controlling on/off of the power supply to low-noise amplifier 6 of the analog base band portion, thus the power supply to low-noise amplifier 6 is turned on/off through the control by control unit 13. Thus, when the detection output from logarithmic amplifier 11 is high, control unit 13 makes power supply control circuit 16 cut off the power supply to low-noise amplifier 6. Hence, low-noise amplifier 6 becomes inoperable, but a small portion of the signal is conveyed to the output side even when low-noise amplifier 6 is inoperable and the circuits in subsequent stages of low-pass filter 7 operate normally.

Therefore, in this embodiment, the operation of low-noise amplifier 6 can be stopped when the level of the input signal is high while the elements in the analog base band portion subsequent to low-pass filter 7 can be operated by a signal supplied from low-noise amplifier 6, whereby saturation at the analog base band portion can be prevented and the generation of distortion can be reduced.

Figure 5:
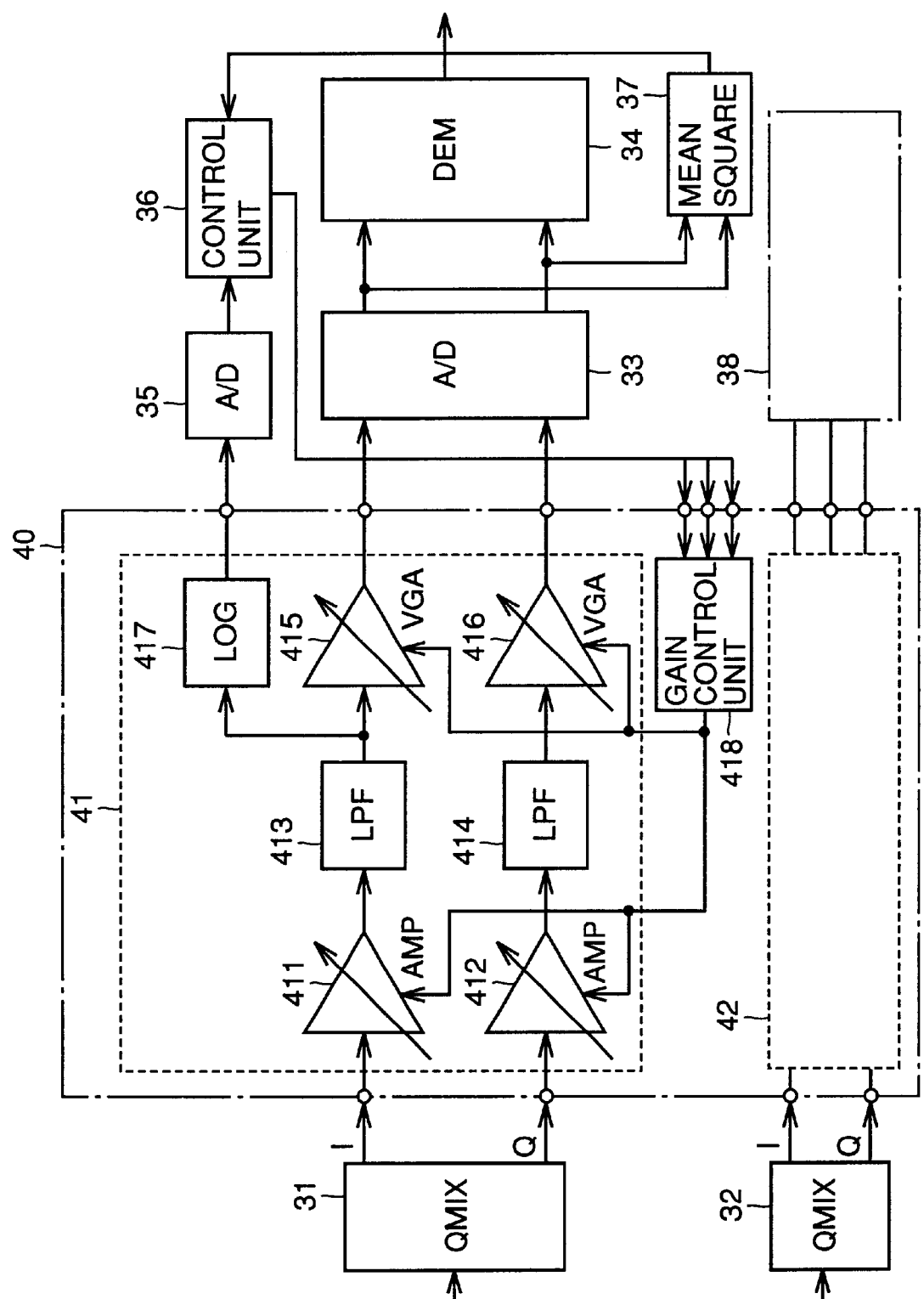
FIG. 5 is a block diagram showing the fourth embodiment of the present invention.

FIG. 5 is a block diagram showing the embodiment in which the analog base band portion is configured with an integrated circuit.

In a portable phone, generally two antennae are provided; one is an external antenna externally extended in use and another is an internal antenna housed inside the phone, and diversity reception system is adapted in which a good signal among signals received by either antenna is selected. Hence, two receiving portions are provided corresponding to two antennae. FIG. 5 shows an example of such receiver.

In FIG. 5, a signal received by one antenna is supplied to a quadrature mixer 31 via a high frequency circuit not shown, then, an I channel signal and a Q channel signal with the same level and different phases by 90 degrees are output from quadrature mixer 31 and supplied to analog base band portion 40. Analog base band portion 40 formed by one integrated circuit has two receiving portions 41 and 42 corresponding to two antennae, respectively. I channel signal and Q channel signal from quadrature mixer 31 mentioned above are both supplied to one receiver portion 41.

Receiver 41 includes low-noise amplifiers 411 and 412, low-pass filters 413 and 414, variable gain amplifiers 415 and 416 and a logarithmic amplifier 417. These are equivalent to double the structure of FIG. 2 for I channel and Q channel. In addition, a gain control unit 418 is provided for controlling gains of low-noise amplifiers 411 and 412 and variable gain amplifiers 415 and 416.

Outputs from variable gain amplifiers 415 and 416 supplied from receiving portion 41 of analog base band portion 40 are supplied to an A/D converter 33 and converted into a digital signal, and the resulting signal is supplied to a demodulating circuit 34 and a mean square deriving circuit 37. An output signal from logarithmic amplifier 417 is supplied to an A/D converter 35 and converted into a digital signal and the resulting signal is supplied to a control unit 36.

Control unit 36 supplies a clock signal, data and an enable signal to gain control unit 418 to control gains of low-noise amplifiers 411 and 412 and variable gain amplifiers 415 and 416. Gain control unit 418 controls gains of low-noise amplifiers 411 and 412 and variable gain amplifiers 415 and 416 based on the supplied clock signal, the data and the enable signal.

Another receiving portion 42 is configured similarly and I channel signal and Q channel signal are supplied from quadrature mixer 32 as inputs and, similarly to receiving portion 41 side, elements equivalent to A/D converter 33, demodulating circuit 34, A/D converter 35 and control unit 36 are provided as a circuit 38 at the output side of receiving portion 42.

Figure 6:
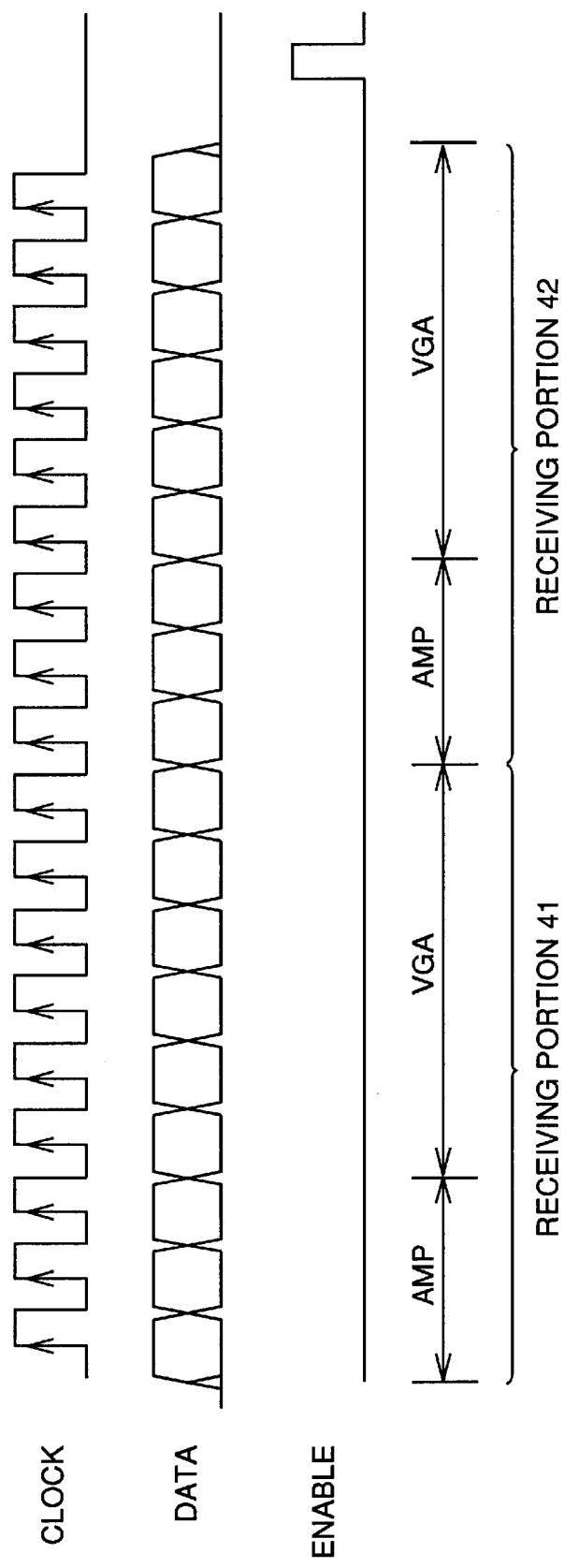
FIG. 6 shows timing charts of a clock signal, data and an enable signal supplied from a control circuit shown in FIG. 5.
Figure 7:
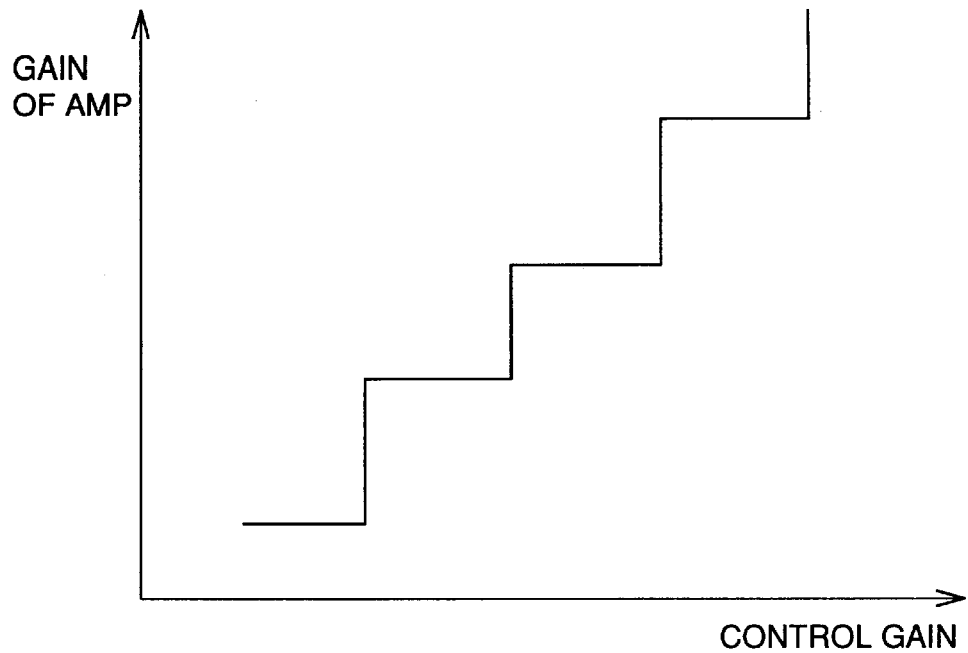
FIG. 7 shows a gain characteristic of an amplifier shown in FIG. 5.
Figure 8:
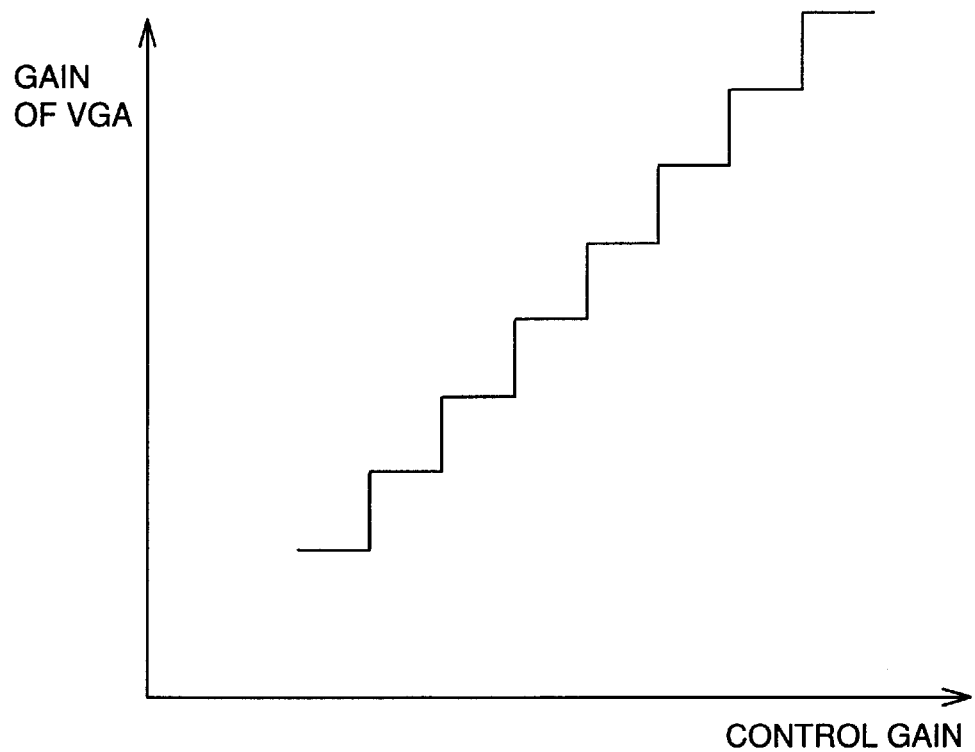
FIG. 8 shows a gain characteristic of a variable gain amplifier shown in FIG. 5.

FIG. 6 shows time charts of the clock signal, the data and the enable signal supplied to the gain control portion of FIG. 5; FIG. 7 shows a gain characteristics of low-noise amplifiers 411 and 412 shown in FIG. 5;, and FIG. 8 shows gain characteristics of variable gain amplifiers 415 and 416 shown in FIG. 5.

Next, with reference to FIGS. 5~8, the operation of the embodiment will be described. Control unit 36 supplies data on gains to be set at low-noise amplifiers 411 and 412 and gains to be set at variable gain amplifiers 415 and 416 based on the detected level of received signal at logarithmic amplifier 417. The data is output in synchronization with the rise of the clock signal as shown in FIG. 6. These data is supplied in time divisional manner corresponding to receiving portion 41 and receiving portion 42, respectively, and in addition, gain setting data for low-noise amplifiers 411 and 412 and gain setting data for variable gain amplifiers 415 and 416 are supplied in a time divisional manner for data of each of receiving portions 41 and 42. Data for low-noise amplifiers 411 and 412 are 3-bit data, for example, and data for variable gain amplifiers 415 and 416 are 6-bit data, for example.

Gain controlling unit 418 sets data supplied from control unit 36 based on the enable signal and sets the gains of low-noise amplifiers 411 and 412 and variable gain amplifiers 415 and 416. In this case, the gains of low-noise amplifiers 411 and 412 change stepwise according to the control gain as shown in FIG. 7 and the gains of variable gain amplifiers 415 and 416 change stepwise according to the control gain as shown in FIG. 8 in a similar manner.

In this embodiment again, control unit 36 controls the gains of low-noise amplifiers 411 and 412 and variable gain amplifiers 415 and 416 based on the detection output of logarithmic amplifier 417 and then performs the control based on the output from mean square deriving circuit 37.

Hence, in the embodiment shown in FIG. 5, the saturation at analog base band portion 40 can be prevented and the analog base band signal of a suitable level can be supplied with little distortion even when the level of the input signal is high.

Thus, according to the present invention, the level of the signal supplied to the variable gain circuit in the analog base band portion is detected, and the gain of the amplifying circuit receiving the base band signal and the gain of the variable gain amplifying circuit amplifying the output of the filter are controlled based on the detection output, whereby saturation of signal can be prevented with low current consumption while accuracy is maintained, and therefore, the present invention is applicable for portable phones or the like.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A wireless terminal device directly converting a high frequency signal to a base band signal comprising:

amplifying circuit receiving said base band signal obtained by the conversion;

filtering circuit removing an interference wave signal component from an output from said amplifying circuit;

variable gain circuit having a variable gain and amplifying an output signal of said filtering circuit;

level detecting circuit detecting a level of a signal input to said variable gain circuit; and controlling circuit switching a gain of said amplifying circuit and controlling a gain of said variable gain circuit based on a detection output of said level detecting circuit.

2. The wireless terminal device according to claim 1 wherein said amplifying circuit has a variable gain and, said controlling circuit changes the gain of said amplifying circuit based on the detection output of said level detecting circuit.

3. The wireless terminal device according to claim 1 wherein said amplifying circuit includes;

a plurality of amplifiers with different gains, and selecting circuit selecting one of said plurality of amplifiers based on a control signal from said controlling circuit.

4. The wireless terminal device according to claim 1 wherein said amplifying circuit includes power supply switching circuit cutting or supplying power supply to said amplifying circuit.

5. The wireless terminal device according to claim 1 wherein said amplifying circuit, said filtering circuit, said variable gain circuit and said level detecting circuit are arranged on the same integrated circuit and said integrated circuit is provided with a gain controlling circuit setting the gain of said amplifying circuit based on a clock signal and data supplied from said controlling circuit.

6. The wireless terminal device according to claim 5 wherein said controlling circuit supplies data on the gain to be set to said amplifying circuit in synchronization with said clock signal in a time divisional manner.

7. The wireless terminal device according to claim 5 wherein said gain controlling circuit switches each of the gain of said amplified circuit in a step-like manner.

* * * * *

UNITED STATES PATENT AND TRADEMARK OFFICE
CERTIFICATE OF CORRECTION

PATENT NO.    : 6,373,907 B1
DATED         : April 16, 2002
INVENTOR(S)   : Takatoshi Katsura et al.

It is certified that error appears in the above-identified patent and that said Letters Patent is hereby corrected as shown below:

<u>Column 1,</u>
Lines 51-52, "$f_{bb}=f_{rx}-f_{ro}$" should read -- $f_{bb}=f_{rx}-f_{lo}$ --

Signed and Sealed this

Eighteenth Day of February, 2003

JAMES E. ROGAN
*Director of the United States Patent and Trademark Office*